United States Patent
Wu

(10) Patent No.: US 7,256,656 B2
(45) Date of Patent: Aug. 14, 2007

(54) ALL-DIGITAL PHASE-LOCKED LOOP

(75) Inventor: Shiao-Yang Wu, Taipei Hsien (TW)

(73) Assignee: Realtek Semiconductor Corp., HsinChu (TW)

(*) Notice: Subject to any disclaimer, the term of this patent is extended or adjusted under 35 U.S.C. 154(b) by 120 days.

(21) Appl. No.: 10/907,044

(22) Filed: Mar. 17, 2005

(65) Prior Publication Data

US 2005/0206458 A1    Sep. 22, 2005

(30) Foreign Application Priority Data

Mar. 22, 2004  (TW) ............................. 93107642 A

(51) Int. Cl.
*H03L 7/091*    (2006.01)
(52) U.S. Cl. .................... 331/17; 327/160; 375/376
(58) Field of Classification Search ................ 331/17; 327/160; 375/376
See application file for complete search history.

(56) References Cited

U.S. PATENT DOCUMENTS

| | | | |
|---|---|---|---|
| 6,275,553 B1 * | 8/2001 | Esaki | .......................... 375/371 |
| 6,404,247 B1 | 6/2002 | Wang | |
| 6,680,633 B2 * | 1/2004 | Gailhard et al. | ............ 327/156 |
| 6,965,660 B2 * | 11/2005 | Strohmayer | ................. 375/376 |

FOREIGN PATENT DOCUMENTS

CN    1095248 C    11/2002

OTHER PUBLICATIONS

Jim Dunning, Gerald Garcia, Jim Lundberg, and Ed Nuckolls, "An all-digital phase -locked loop with 50-cycle lock time suitable for high-performance microprocessors", pp. 412-pp. 422 IEEE journal of solid-state circuits, vol. 30, No. 4, Apr. 1995.

* cited by examiner

Primary Examiner—Robert Pascal
Assistant Examiner—James Goodley
(74) Attorney, Agent, or Firm—Winston Hsu

(57) ABSTRACT

An all-digital phase-locked loop (ADPLL) includes: a digital phase frequency detector (PFD) for generating a detection signal by detecting frequency difference and phase difference between a reference signal and a feedback signal; a digital phase difference counter coupled to the digital PFD for sampling the detection signal according to an oscillator signal to thereby generate a count value; a digital filter coupled to the digital phase difference counter for generating a control signal according to the count value; a digital controlled oscillator (DCO) coupled to the digital filter for generating the oscillator signal according to the control signal; and a frequency divider coupled to the DCO and the digital PFD for generating the feedback signal by dividing the oscillator signal.

14 Claims, 2 Drawing Sheets

ALL-DIGITAL PHASE-LOCKED LOOP

BACKGROUND OF INVENTION

1. Field of the Invention

The present invention relates to an all-digital phase-locked loop, and more particularly, to an all-digital phase-locked loop in a frequency synthesizer.

2. Description of the Prior Art

Phase-locked loop (PLL) can be used for clock/data recovery, frequency or phase modulation/demodulation, and generating clocks having stable frequency. In general, a conventional PLL is usually implemented as an analog PLL that comprises a phase frequency detector (PFD) for detecting phase and frequency of signals and a loop filter for adjusting the operation of a VCO according to the detection result of the PFD.

Passive components of an analog PLL are easily affected by noise such that undesirable effects may be caused. Therefore, it is more and more popular to utilize digital architecture to implement PLLs. Additionally, processing digital signals is often easier than processing analog signals. However, some components of a conventional digital PLL, such as a digital loop filter and a digital controlled oscillator (DCO), requires an external high frequency signal as the working clock. This requirement not only increases the implementation cost but also limits the performance of the system using the conventional digital PLL due to the source of the external high frequency signal.

SUMMARY OF INVENTION

It is therefore an objective of the claimed invention to provide an all-digital phase-locked loop (ADPLL) for solving the above-mentioned problems.

According to a preferred embodiment, an all-digital phase-locked loop (ADPLL) of the present invention includes: a digital phase frequency detector (PFD) for detecting frequency difference and phase difference between a reference signal and a feedback signal to thereby generate a detection signal; a digital phase difference counter for sampling the detection signal according to an oscillator signal, so as to generate a count value; a digital filter for generating a control signal according to the count value; a digital controlled oscillator (DCO) for generating the oscillator signal according to the control signal; and a frequency divider coupled between the DCO and the digital PFD for generating the feedback signal by dividing the oscillator signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
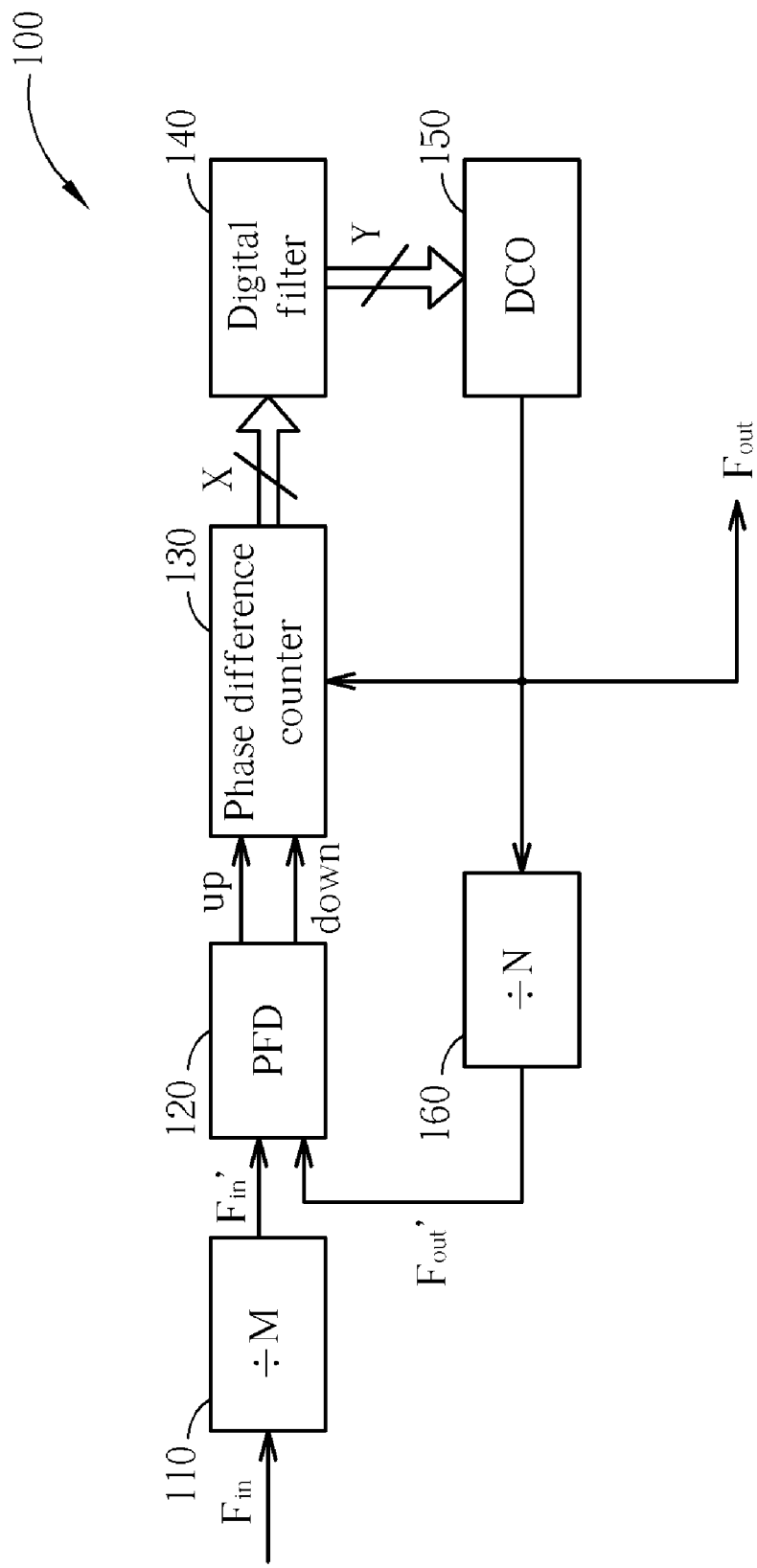
FIG. 1 is a schematic diagram of an all-digital phase-locked loop according to the present invention.

FIG. 1 depicts a schematic diagram of an all-digital phase-locked loop (ADPLL) 100 in a frequency synthesizer according to the present invention. The ADPLL 100 comprises: a first frequency divider 110 for dividing an input signal Fin to generate a reference signal Fin'; a phase frequency detector (PFD) 120 for detecting frequency difference and phase difference between the reference signal Fin' and a feedback signal Fout' to thereby generate an up/down signal; a digital phase difference counter 130 for sampling the up/down signal according to an oscillator signal Fout to thereby generate a count value X; a digital filter 140 for generating a control signal Y according to the count value X; a digital controlled oscillator (DCO) 150 coupled to the digital filter 140 for generating the oscillator signal Fout according to the control signal Y; and a second frequency divider 160 for generating the feedback signal Fout' by dividing the oscillator signal Fout.

In the synthesizer, the ADPLL 100 is employed to generate the oscillator signal Fout, wherein the frequency of the oscillator signal is times of the frequency of the input signal Fin. As shown in FIG. 1, the frequency of the oscillator signal Fout should be N/M times of the frequency of the input signal Fin. The frequency of the oscillator signal Fout can be adjusted by controlling the frequency dividers 110 and 160: for instance, change at least one of the divisors M and N of the frequency dividers 110 and 160. Besides, the frequency dividers 110 and 160 can be replaced with a programmable fractional frequency divider.

In the present invention, the digital phase difference counter 130 of the ADPLL 100 can be an up-down counter. The count value X outputted from the digital phase difference counter 130 represents the phase difference between the reference signal Fin' and the feedback signal Fout'. In a preferred embodiment, the digital phase difference counter 130 employs the oscillator signal Fout as the working clock to sample the up/down signal without using any external high frequency clock.

Figure 2:
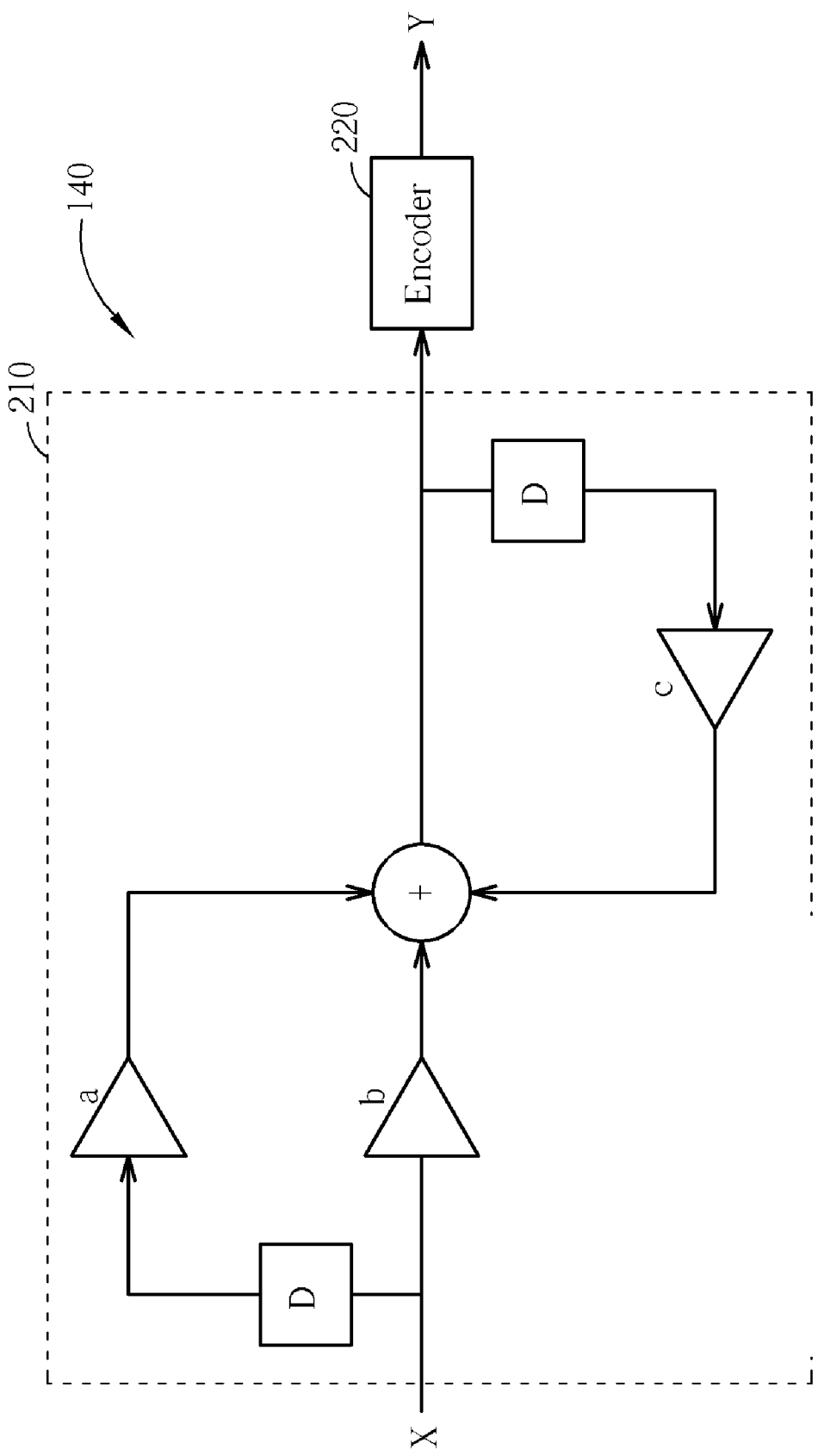
FIG. 2 is a schematic diagram of a digital filter according to the present invention.

FIG. 2 depicts a schematic diagram of one embodiment of the digital filter 140 according to the present invention. The digital filter 140 comprises a first order butterworth filter 210 and an encoder 220, and the symbols a, b and c are coefficients of the filter 210. In this embodiment, the encoder 220 is used for doing the complement computation of two to the output value of the filter 210, and then transferring the computed result into an unsigned magnitude. Additionally, the digital filter 140 can be realized by using an infinite impulse response (IIR) digital filter or a finite impulse response (FIR) digital filter, and the order number of the digital filter 140 can be adjusted.

In order to achieve the stability of the APDLL, the digital filter 140 should provide at least one pole located at a predetermined distance from the DC level within a frequency spectrum of the ADPLL 100. When the number of the poles increases, the sufficient phase margin is needed to maintain the stability of the loop.

After the digital filter 140 transferred the count value X into the digital control signal Y, the ADPLL 100 utilizes the control signal Y to adjust the frequency of DCO 150. Consequently, the frequencies of the oscillator signal Fout and the feedback signal Fout' are changed correspondingly, so that the frequency of the feedback signal Fout' matches the frequency of the reference signal Fin'. Therefore, the frequency synthesis function of the frequency synthesizer is achieved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An all-digital phase-locked loop (ADPLL) comprising:
 a digital phase frequency detector (PFD) for detecting frequency difference and phase difference between a reference signal and a feedback signal to thereby generate a detection signal;
 a digital phase difference counter coupled to the digital phase frequency detector for sampling the detection signal according to an oscillator signal to thereby generate a count value;
 a digital filter coupled to the digital phase difference counter for generating a control signal according to the count value, comprising:
  a delay unit for delaying the count value to generate a delayed count value;
  a calculating unit for calculating the count value and the delayed count value to generate a calculated value; and
  an encoder coupled to the calculating unit for generating the control signal according to the calculated value;
 a digital controlled oscillator (DCO) coupled to the digital filter for generating the oscillator signal according to the control signal; and
 a frequency divider coupled to the digital controlled oscillator and the digital phase frequency detector for generating the feedback signal by dividing the oscillator signal.

2. The all-digital phase-locked loop of claim 1, wherein the all-digital phase-locked loop is used in a frequency synthesizer.

3. The all-digital phase-locked loop of claim 1, wherein the digital filter is an infinite impulse response (IIR) filter.

4. The all-digital phase-locked loop of claim 1, wherein the digital filter has one or more poles and each of the poles is located at a predetermined distance from a DC level within the frequency spectrum of the all-digital phase-locked loop.

5. The all-digital phase-locked loop of claim 1, wherein the digital filter is a finite impulse response (FIR) filter.

6. A digital phase-locked loop (DPLL) comprising:
 a phase frequency detector (PFD) for detecting a reference signal and a feedback signal to generate a detection signal;
 an difference estimator coupled to the phase frequency detector for sampling the detection signal and generating an estimation signal according to an oscillator signal;
 a digital filter coupled to the difference estimator for generating a control signal according to the estimation signal, comprising:
  a delay unit for delaying the estimation signal to generate a delayed estimation signal;
  a calculating unit for calculating the estimation signal and the delayed estimation signal to generate a calculated value; and
  an encoder coupled to the calculating unit for generating the control signal according to the calculated value;
 and
 a digital controlled oscillator (DCO) coupled to the digital filter for generating the oscillator according to the control signal; wherein the feedback signal corresponds to the oscillator signal.

7. The digital phase-locked loop of claim 6, wherein the detection signal corresponds to at least one of the phase difference and the frequency difference between the reference signal and the feedback signal.

8. The digital phase-locked loop of claim 6, wherein the difference estimator samples the detection signal according to a sampling signal corresponding to the oscillator signal.

9. The digital phase-locked loop of claim 8, wherein the difference estimator is a counter.

10. The digital phase-locked loop of claim 6, wherein the digital filter is an infinite impulse response (IIR) filter.

11. The digital phase-locked loop of claim 6, wherein the digital filter is a finite impulse response (FIR) filter.

12. The digital phase-locked loop of claim 6, wherein the digital filter provides one or more poles and each of the poles is located at a predetermined distance from a DC level within a frequency spectrum of the digital phase-locked loop.

13. The digital phase-locked loop of claim 6, wherein the digital controlled oscillator adjusts at least one of the frequency and the phase of the oscillator signal according to the control signal.

14. The digital phase-locked loop of claim 6, further comprising a frequency divider for generating the feedback signal according to the oscillator signal.

* * * * *